(12) United States Patent
Umeki

(10) Patent No.: US 8,604,675 B2
(45) Date of Patent: Dec. 10, 2013

(54) PIEZOELECTRIC RESONATOR AND METHOD OF MANUFACTURING PIEZOELECTRIC RESONATOR

(75) Inventor: Mitoshi Umeki, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 311 days.

(21) Appl. No.: 12/932,832

(22) Filed: Mar. 8, 2011

(65) Prior Publication Data

US 2011/0221309 A1 Sep. 15, 2011

(30) Foreign Application Priority Data

Mar. 9, 2010 (JP) ................................. 2010-052270

(51) Int. Cl.
*H01L 41/053* (2006.01)
*H01L 41/22* (2013.01)

(52) U.S. Cl.
USPC ........................... 310/344; 310/348; 29/25.35

(58) Field of Classification Search
USPC .................. 310/340, 344, 348, 370; 29/25.35
See application file for complete search history.

(56) References Cited

U.S. PATENT DOCUMENTS

| | | | | |
|---|---|---|---|---|
| 2,326,923 | A | * | 8/1943 | Bokovoy ........................ 310/354 |
| 3,073,975 | A | * | 1/1963 | Bigler et al. .................... 310/344 |
| 3,453,458 | A | * | 7/1969 | Smith et al. ..................... 310/344 |
| 4,293,986 | A | * | 10/1981 | Kobayashi et al. ........... 29/25.35 |
| 4,362,961 | A | * | 12/1982 | Gerber ........................... 310/370 |
| 5,198,716 | A | * | 3/1993 | Godshall et al. ............... 310/349 |
| 5,430,345 | A | * | 7/1995 | Takahashi ...................... 310/348 |
| 7,940,146 | B2 | * | 5/2011 | Oda ................................. 333/193 |
| 2006/0255691 | A1 | | 11/2006 | Kuroda et al. |
| 2011/0068659 | A1 | * | 3/2011 | Ichikawa ........................ 310/344 |
| 2011/0227457 | A1 | * | 9/2011 | Ishikawa et al. ............... 310/344 |
| 2012/0043859 | A1 | * | 2/2012 | Ichikawa et al. ............... 310/344 |

FOREIGN PATENT DOCUMENTS

| | | |
|---|---|---|
| CN | 101199113 | 6/2008 |
| CN | 101330282 | 12/2008 |
| JP | 1-215108 | 8/1989 |
| JP | 2-107015 | 4/1990 |
| JP | 11-103233 | 4/1999 |
| JP | 2000-164747 | 6/2000 |
| JP | 2004-222006 | 8/2004 |
| JP | WO 2007/040051 | 4/2007 |
| JP | 2007-181130 | 7/2007 |
| JP | 2008/118501 | 5/2008 |
| JP | 2009-022003 | 1/2009 |

* cited by examiner

*Primary Examiner* — Thomas Dougherty
(74) *Attorney, Agent, or Firm* — Jordan and Hamburg LLP

(57) ABSTRACT

To provide a piezoelectric resonator that suppresses spread of a conductive adhesive and is low in cost and a method of manufacturing a piezoelectric resonator. At positions, of a base 3, corresponding to electrode terminals on a crystal resonating piece 10, projection portions 41, 42 are formed by etching the base 3, and a metal film is formed on front surfaces of the above projection portions 41, 42, and the above metal films and the electrode terminals on the above-described crystal resonating piece 10 are electrically connected with a conductive adhesive 34. The conductive adhesives 34 rise on side surfaces of the above-described projection portions 41, 42 due to surface tension to bring the conductive adhesives 34 into a state where they do not easily flow outward, so that it is possible to suppress spread of the conductive adhesives 34. Further, it is possible to reduce a film thickness of the metal film to be formed on the front surfaces of the projection portions 41, 42, so that the crystal resonating piece 10 is reduced in cost.

4 Claims, 9 Drawing Sheets

(a)

(b)

(c)

(a)

(b)

(a)

(b)

(c)

(d)

(h)

(i)

(j)

(a)

(b)

(a)

(b)

(a)

(b)

PIEZOELECTRIC RESONATOR AND METHOD OF MANUFACTURING PIEZOELECTRIC RESONATOR

BACKGROUND OF THE INVENTION

1. Field of the Invention

The present invention relates to a piezoelectric resonator and a method of manufacturing a piezoelectric resonator, and relates to a technique of a piezoelectric resonator that is low in cost and has small variations in a device characteristic.

2. Description of the Related Art

A piezoelectric resonator in an SMD (a surface-mount) structure, which is, for example, a crystal resonator (that will be called an "SMD-type crystal resonator", hereinafter), is small in size lightweight, so that it is housed in a portable electronic device represented as, for example, a cellular phone as a reference source of frequency or time. One example of the above SMD-type crystal resonator will be explained by using FIG. 9(a) and FIG. 9(b). In the drawings, 11 denotes a ceramic base with an upper surface open, and 12 denotes a metal cover, and the base 11 and the cover 12 are seam-welded with a sealing member 13 made of, for example, a welding material, and the inside thereof is in a vacuum state.

In the drawings, 10 denotes a crystal resonating piece, and as the above crystal resonating piece 10, a tuning-fork crystal resonating piece, a rectangular-shaped crystal resonating piece, or the like can be used. The tuning-fork crystal resonating piece 10 will be explained by using FIG. 10. Paired vibrating arm portions 21a and 21b are provided in a base portion 2, and in both main surfaces of the respective vibrating arm portions 21a, 21b, groove portions 23, 24 are provided respectively. In the groove portions 23, 24 and on the respective vibrating arm portions 21a, 21b, a not-illustrated excitation electrode for exciting tuning-fork vibration based on flexural vibration is formed. Further, on a base 11 side of the crystal resonating piece 10, first and second electrode terminals (that are not-illustrated) to be electrically connected to the above-described excitation electrodes respectively are led out to the base 11 side from the excitation electrodes to be provided on the right and left.

The above crystal resonating piece 10 has the electrode terminals on the base portion 2 fixed to a pedestal portion 14 of the base 11 with a conductive adhesive 15 in the posture in which the vibrating arm portions 21a, 21b extend sideways in an inner space formed by the base 11 and the cover 12, and in this manner, the crystal resonating piece 10 is attached to the base 11 substantially horizontally. On the other hand, in the region, of the pedestal portion 14, to which one end side of the crystal resonating piece 10 is attached, conductive paths 16, 17 are formed (17 denotes the conductive path positioned on a far side of the paper). An oscillation operation of the crystal resonating piece 10 formed in this manner is caused when voltage is applied to the crystal resonating piece 10 via electrodes 18, 19 provided on an outer bottom surface of the base 11 in a longitudinal direction so as to face each other, the conductive paths 16, 17, and the conductive adhesive 15.

However, in the SMD-type crystal resonator as above, the region, of the pedestal portion 14, to which the one end side of the crystal resonating piece 10 is attached is substantially the same as other regions in height. Thus, the conductive adhesive 15 easily flows outward, and the conductive adhesive spreads over an area larger than necessary. Accordingly, the region where the conductive adhesive 15 spreads varies in element, and thus there is a problem that variations in terms of a device characteristic easily occur.

In order to solve the above problem, it has been considered that the height of the region, of the base 11, to which the electrode terminals on the crystal resonating piece 10 are attached is increased to be higher than those of the other regions to make it difficult for the conductive adhesive to spread. A structure in which, for example, on the base 11 side, projection-shaped electrodes each made of a conductive material are provided, and the above projection-shaped electrodes and the electrode terminals on the crystal resonating piece 10 are electrically connected with a conductive adhesive has been thought.

The projection-shaped electrodes as above each have been formed in a manner that, in general, for example, a base metal made of tungsten (W) and so on is formed on the base 11 to have a film thickness of 10 μm to 15 μm or so, and then on the base metal, nickel (Ni)/gold (Au) plating is performed. Here, the thickness of the base metal is 10 μm to 15 μm or so, so that a thickness of Au has to be 10 μm to 30 μm or so in order to obtain a height of each of the projection-shaped electrodes, and Au is expensive to thus cause a problem in terms of cost.

In the above case, it is also thought that a metal more inexpensive than Au is used to obtain the height of each of the projection-shaped electrodes, and then on a front surface of the metal, Ni/Au plating is performed. However, in the above method, film forming of the metal for increasing the projection-shaped electrodes in height and film forming of Au have to be performed, thereby increasing the number of processes, resulting that an increase in cost is caused.

However, in Patent Document 1, there has been described a structure in which an independent projecting portion is provided at electrode forming positions on an upper surface of an insulating base. The above example is to achieve a reduction in cost by reducing materials for forming the insulating base, but in practice, it has not been described by which method the projecting portions are manufactured, resulting that the structure in Document 1 also cannot solve the problem of the present invention.

[Patent Document 1] Japanese Patent Application Laid-open No. 2000-164747 (paragraph 0017, FIG. 5)

SUMMARY OF THE INVENTION

The present invention has been made under such circumstances, and has an object to provide a piezoelectric resonator that suppresses spread of a conductive adhesive and is low in cost and a method of manufacturing a piezoelectric resonator.

Accordingly, the present invention includes:

a base made of glass or crystal;

a cover made of the same material as that of the base and forming an airtight space by airtightly sealing one surface side of the base;

a piezoelectric resonating piece, in the airtight space, placed on the base and having excitation electrodes formed on a front surface thereof and having first and second electrode terminals that are electrically connected to the excitation electrodes provided on a base side thereof;

first and second projection portions formed at positions corresponding to the first and second electrode terminals on the piezoelectric resonating piece respectively by etching the base and whose upper surfaces are flat;

a metal film formed on front surfaces of the projection portions and electrically connected to external terminals; and a conductive adhesive for electrically connecting the metal films and the electrode terminals on the piezoelectric resonating piece respectively.

The projection portions preferably each have a shape whose cross section is enlarged as it goes downward from an upper surface. Further, a distance between the upper surface and a bottom portion of each of the projection portions is preferably not less than 10 μm nor more than 50 μm. Further, a thickness of the metal film is preferably not less than 0.2 μm nor more than 0.5 μm.

A method of manufacturing a piezoelectric resonator of the present invention includes:

forming a base provided with a recessed portion in which a piezoelectric resonating piece is housed and projection portions by etching a front surface of a glass substrate or a crystal substrate with a mask;

forming a metal film on a front surface of the above base; and forming a metal film on front surfaces of the projection portions by etching the metal film.

In the present invention, at the positions, of the base, corresponding to the electrode terminals on the piezoelectric resonating piece, the projection portions are provided by etching the base, and the metal film is formed on the front surfaces of the above projection portions, and the above metal films and the electrode terminals on the above-described piezoelectric resonating piece are electrically connected with the conductive adhesive. Thus, the conductive adhesives rise on side surfaces of the projection portions due to surface tension to bring the conductive adhesives into a state where they do not easily flow outward, so that it is possible to suppress spread of the conductive adhesives. Further, it is possible to reduce a film thickness of the metal film to be formed on the front surfaces of the projection portions, so that the piezoelectric resonator is reduced in cost.

DETAILED DESCRIPTION OF THE PREFERRED EMBODIMENT(S)

Figure 1:
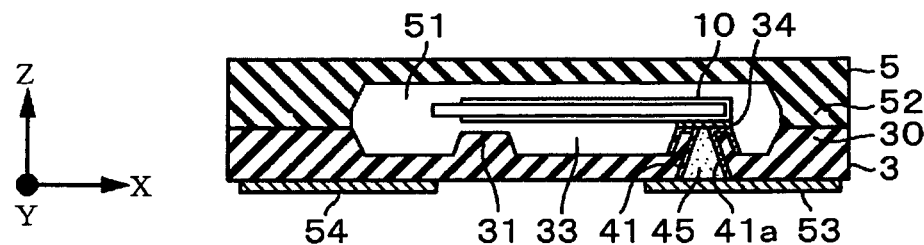
FIG. 1(a) and FIG. 1(c) are schematic vertical cross-sectional views illustrating a crystal resonator according to an embodiment of the present invention.
FIG. 1(b) is a plan view illustrating the crystal resonator according to the embodiment of the present invention.
Figure 1:
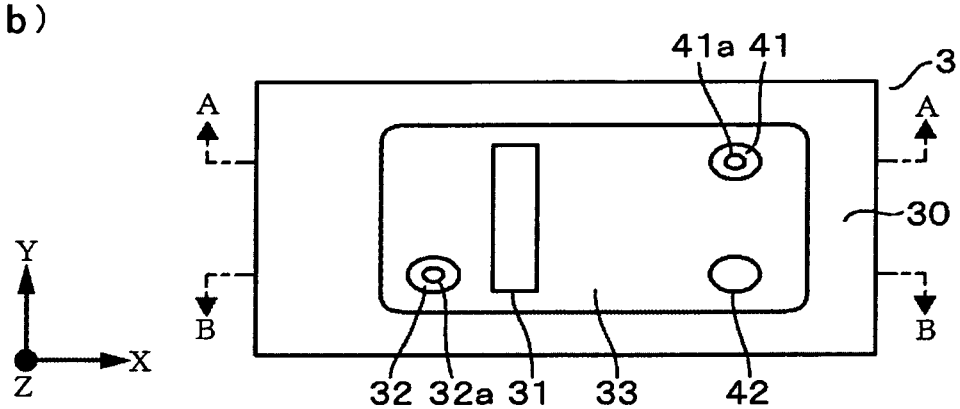
Figure 1:
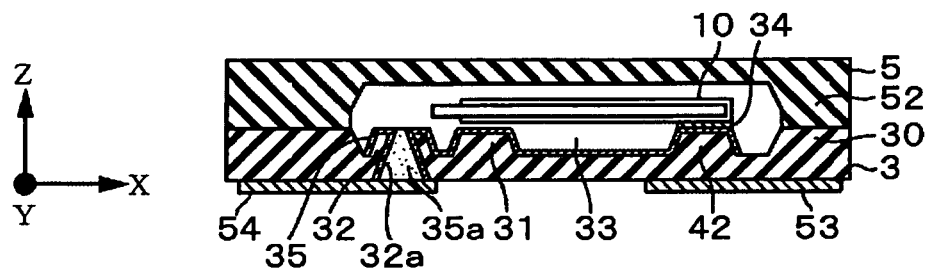

A structure of a crystal resonator being a piezoelectric resonator according to an embodiment of the present invention will be explained with reference to FIG. 1(a) to FIG. 1(c). In FIG. 1(a) to FIG. 1(c), 3 denotes a rectangular-shaped base made of glass, and on a front surface of the above base 3, first and second projection portions 41, 42, a pillow portion 31, a projecting portion 32 for connecting to a later-described external terminal, and a peripheral edge portion 30 are formed, and the region except the projection portions 41, 42, the pillow portion 31, the projecting portion 32, and the peripheral edge portion 30 is formed as a recessed portion 33. FIG. 1(a) is an A-A cross-sectional view of the above-described crystal resonator, FIG. 1(b) is a plan view when the above-described base 3 is seen from a front surface side (one surface side), and FIG. 1(c) is a B-B cross-sectional view of the above-described crystal resonator.

Figure 2:
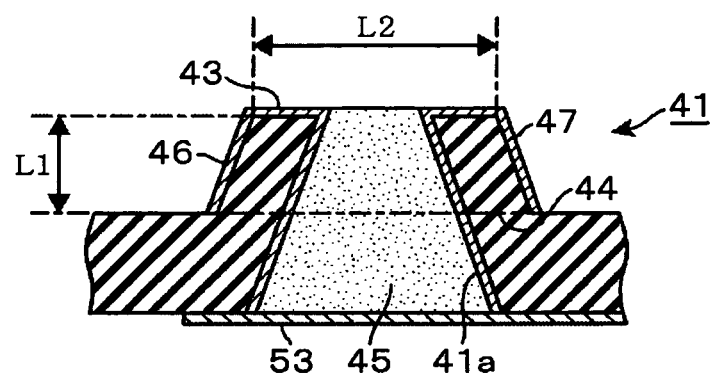
FIG. 2 is a schematic cross-sectional view illustrating one portion of the crystal resonator according to the embodiment of the present invention.
Figure 3:
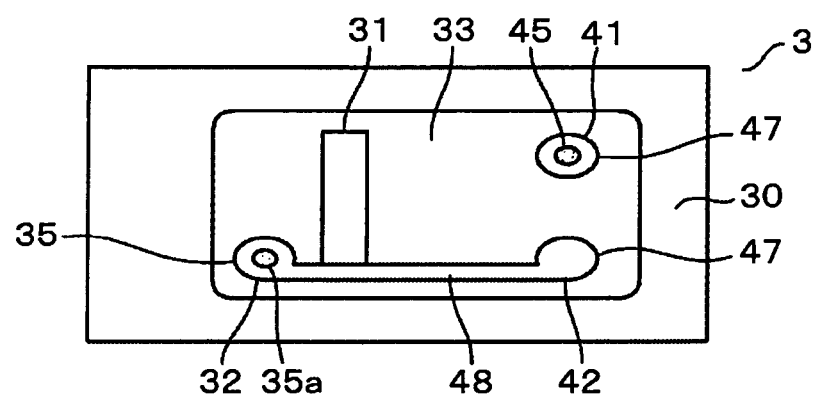
FIG. 3(a) and FIG. 3(b) are plan views of a front surface side and a rear surface side of the crystal resonator according to the embodiment of the present invention.
Figure 3:
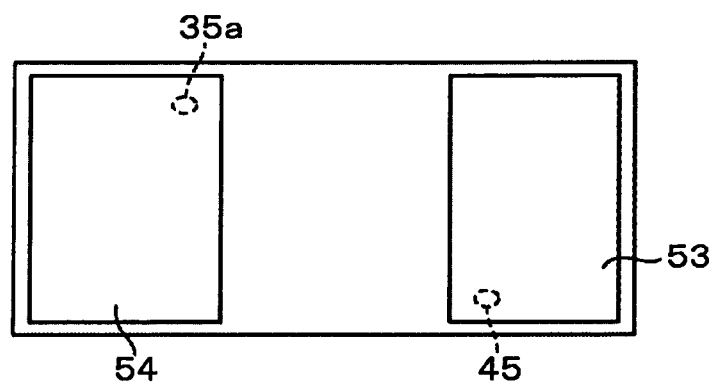
Figure 10:
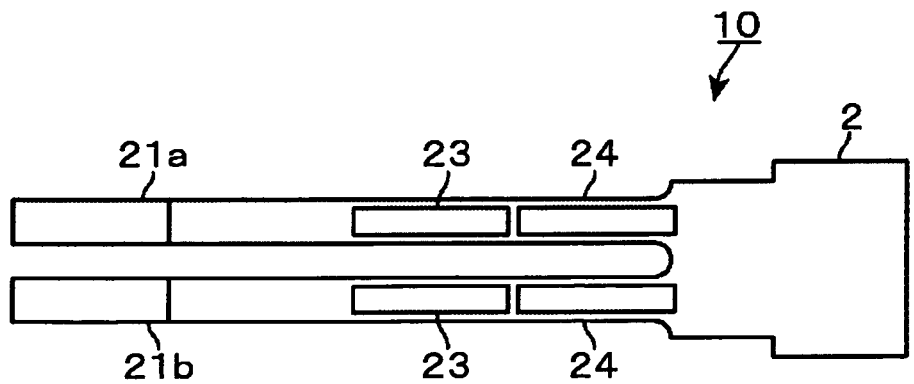
FIG. 10 is a schematic plan view illustrating one example of a tuning-fork crystal resonating piece.

In the drawings, 10 denotes a crystal resonating piece explained in DESCRIPTION OF THE RELATED ART by using FIG. 10, and the above-described projection portions 41, 42 are provided at positions corresponding to first and second electrode terminals (that are not illustrated) on a base portion 2 in the above crystal resonating piece 10. These projection portions 41, 42, as is the projection portion 41 illustrated in FIG. 2 as an example, are formed so as to have upper surfaces 43 thereof formed as horizontal surfaces and have cross sections thereof enlarged from the upper surfaces 43 to bottom portions 44 of the projection portions 41, 42. These projection portions 41, 42 are formed by etching the base 3. Further, on front surfaces of these projection portions 41, 42, a metal film 47 is coated, and the projection portions 41, 42 each form a bump electrode.

In the above example, a through hole (electrode through hole) 41a is formed in the projection portion 41, and an Au eutectic metal 45 made of, for example, AuSi, AuSn, AuGe, and so on is melted inside the through hole 41a. Further, the above-described upper surfaces 43 and side surfaces 46 of the above-described projection portions 41, 42, and an inner surface of the through hole 41a of the projection portion 41 are coated with the metal film 47. As the above metal film 47, one in which, for example, a lower layer film made of chromium (Cr), a middle layer film made of NiW (nickel tungsten), and an upper layer film made of gold (Au) are stacked is used. The reason why Cr is used as a base metal to form the film in this manner is to increase adhesion of the Au film. Incidentally, in FIG. 1(b), the metal film 47 is omitted for convenience of illustration.

In the above example, as illustrated in FIG. 1(c), a through hole is not formed in the projection portion 42. Further, on the front surface side of the above-described base 3, as illustrated in FIG. 3(a), a predetermined-shaped electrode pattern 48 to be connected to the metal film 47 on the projection portion 42 is formed, and the electrode pattern 48 and the metal film 47 are integrally formed in practice.

A height of each of the upper surfaces 43 of the above-described projection portions 41, 42 is equal to that of the peripheral edge portion 30 of the base 3, for example, and a height L1 of each of the projection portions 41, 42 (a distance between the upper surface 43 and the bottom portion 44) is preferably 10 μm to 50 μm or so. This is because if the height L1 is too high, an interval between a crystal resonating piece 10 and a cover 5 is reduced, resulting that an oscillation characteristic deteriorates and it becomes impossible to respond to a reduction in height of a package, and if the height L1 is too short, spread of a conductive adhesive is increased as will be described later. Further, as for the above-described metal film 47, a thickness of Cr is preferably, for example, 0.05 μm to 0.15 μm, and is more preferably 0.08 μm to 0.15 μm or so, and a thickness of NiW is preferably 0.05 μm to 0.1 μm or so, and a thickness of Au is preferably, for example, 0.2 μm to 0.5 μm or so. This is because if the thickness of Au is smaller than, for example, 0.2 μm, there is a risk that electric conductivity cannot be obtained, and if it is larger than 0.5 μm, a manufacturing cost is increased.

Further, a shape of the above-described upper surface 43 is an ellipse shape in the above example, and a length L2 of the upper surface 43 (length in an X direction in FIG. 1(b)) is preferably, for example, 150 μm to 300 μm or so, and an area of the upper surface 43 is preferably 0.01 mm$^2$ to 0.2 mm$^2$ or so. This is because if the above-described length L2 (area) are too small, there is a risk that the crystal resonating piece 10 is not sufficiently fixed to the base 3 to make an operation unstable, and if the above-described length L2 (area) are too large, the spread of the conductive adhesive is increased as will be described later eventually. Incidentally, the shape of the upper surface 43 is not necessarily limited to the ellipse shape, and it may be a circular shape or a polygonal shape.

The corresponding electrode terminals on the crystal resonating piece 10 are connected to the upper surfaces 43 of these projection portions 41, 42 via conductive adhesives 34, and thereby the crystal resonating piece 10 is fixed to the upper surfaces 43 of the projection portions 41, 42 in a horizontal state.

The above-described pillow portion 31 is also formed of the same material as that of the base 3, and is provided at a position close to a tip side from the center in a length direction of the crystal resonating piece 10 (the X direction in FIG. 1(b)) when the crystal resonating piece 10 is attached to the projection portions 41, 42. An upper surface of the above pillow portion 31 is formed as a horizontal surface, and a height of the upper surface is equal to that of the peripheral edge portion 30 of the base 3, for example. A rear surface of the crystal resonating piece 10 when the crystal resonating piece 10 is fixed to the projection portions 41, 42 stays slightly above the upper surfaces of the projection portions 41, 42, resulting that the rear surface also stays slightly above the upper surface of the pillow portion 31.

The upper surface of the pillow portion 31 is formed in a quadrangular shape extending in a width direction of the crystal resonating piece 10 (a Y direction in FIG. 1(b)) in the above example, and an area of the upper surface is preferably 0.025 mm$^2$ to 0.05 mm$^2$ or so. The reason why the pillow portion 31 is provided in this manner is to design the crystal resonating piece 10 not to break when force is applied to the crystal resonator in an up and down direction. The above pillow portion 31 is provided, and thereby shakes of the crystal resonating piece 10 are reduced, so that the break of the crystal resonating piece can be prevented even though the crystal resonator collides.

The above-described projecting portion 32 for connection is provided in order to electrically connect the electrode terminals on the crystal resonating piece 10 and the later-described external terminal. A through hole 32a is formed inside the projecting portion 32, and a front surface of the projecting portion 32 and an inner surface of the through hole 32a are coated with a metal film 35, and in the through hole 32a, an Au eutectic metal 35a made of, for example, AuSi, AuSn, AuGe, and so on is melted. Further, the above-described metal film 35, as illustrated in FIG. 3(a), is electrically connected to the metal film 47 on the projection portion 42 by the electrode pattern 48, and the metal films 35, 47, and the electrode pattern 48 are integrally formed.

Further, on an upper side of the base 3, the rectangular-shaped cover 5 having a recessed portion 51 formed therein above the crystal resonating piece 10 is airtightly connected to the base 3 in a state where the crystal resonating piece 10 is housed inside. The above cover 5 is formed of a material similar to that of the base 3. When the base 3 and the cover 5 are formed of the similar material in this manner, their thermal expansion coefficients become the same, so that distortions at the time of a heat treatment are suppressed, and thereby an adverse effect on a device characteristic can be suppressed. The above cover 5 is joined to an upper surface of the base 3 with a eutectic metal made of AuSi, AuSn, AuGe, and so on so that a peripheral edge portion 52 of the cover 5 and the peripheral edge portion 30 of the base 3 correspond to each other. Further, it may be designed that the base 3 and the cover 5 are joined to each other by low melting point glass joining.

Further, on a rear surface of the base 3, an external terminal 53 is provided so as to be connected to the eutectic metal 45 in the through hole 41a, and an external terminal 54 is provided so as to be connected to the eutectic metal 35a in the through hole 32a. An oscillation operation of the crystal resonator 1 formed in this manner is caused when voltage is applied to the electrode terminal on one side on the base portion 2 of the crystal resonating piece 10 via the external terminal 53, the eutectic metal 45 in the projection portion 41, the metal film 47 on the projection portion 41, and the conductive adhesive 34 and voltage is applied to the electrode terminal on the other side on the base portion 2 of the crystal resonating piece 10 via the external terminal 54, the eutectic metal 35a in the projecting portion 32, the electrode pattern 48, the metal film 47 on the projection portion 42, and the conductive adhesive 34.

Figure 4:
FIG. 4(a) to FIG. 4(d) are schematic cross-sectional views illustrating a method of manufacturing a crystal resonator according to an embodiment of the present invention.
Figure 4:
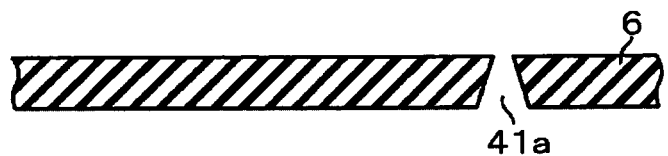
Figure 4:
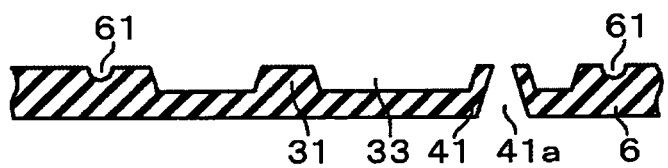
Figure 4:
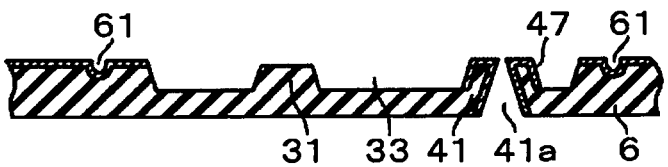

Next, a method of manufacturing the crystal resonator illustrated in FIG. 1(a) to FIG. 1(c) will be explained with reference to FIG. 4(a) to FIG. 4(d) to FIG. 6(h) to FIG. 6(j). Incidentally, in FIG. 4(a) to FIG. 4(d) to FIG. 6(h) to FIG. 6(j), the single crystal resonator to be manufactured on a certain portion of one glass substrate will be explained. First, a cut out single glass substrate 6 is polished to be washed (FIG. 4(a)), and then, as illustrated in FIG. 4(b), the through holes 41a (32a) are formed in the glass substrate 6 by wet etching. Concretely, a metal film in which Au is stacked on Cr is formed on both surfaces, and further, on the above metal films, a resist pattern corresponding to the positions and shapes of the through holes 41a (32a) is formed. Next, the glass substrate 6 is immersed in a KI (potassium iodide) solution and the portions where the metal film is exposed are etched and a metal film pattern is obtained. Thereafter, the glass substrate 6 is immersed in a hydrofluoric acid solution and is etched by using the metal film pattern as a mask, and thereby the through holes 41a (32a) are formed. In an example in the drawings, the metal film pattern is formed on a rear surface side (the other surface side) of the glass substrate 6, and etching progresses from the rear surface side. Incidentally, the through holes 41a (32a) may also be formed by a sandblasting process.

Next, the above-described metal film pattern is removed, and then the glass substrate 6 is wet-etched, and the projection portions 41, 42, the pillow portion 31, and the projecting portion 32 that are previously described in FIG. 1(a) to FIG. 1(c) are formed. Incidentally, in this etching, a groove portion 61 is formed at positions corresponding to scribe lines so that when the glass substrate 6 is cut into pieces in a later process, the cutting work is performed smoothly. Also in the above etching process, a metal film pattern is formed via a resist pattern as described above, and a hydrofluoric acid solution is used and etching is performed. Thereafter, the metal film pattern is removed (FIG. 4(c)).

Thereafter, on the entire surface of the glass substrate 6, a metal film in which Cr, NiW, and Au are stacked in this order from below is formed. Here, a Cr film and an Au film are formed by sputtering or a vacuum vapor deposition method, and, for example, the Cr film is formed to have a thickness of 0.05 µm to 0.1 µm, and NiW is formed to have a thickness of 0.05 µm to 0.1 µm, and an Au film is formed to have a thickness of 0.2 µm. Thereby, the metal film is formed on a front surface side of the glass substrate 6 and the inner surfaces of the through holes 41a (32a). Next, a resist pattern is formed on the above metal film, and then the glass substrate 6 is immersed in a KI solution, and a metal film pattern corresponding to the metal films 47, 35, and the electrode pattern 48 as illustrated in FIG. 3(a) and FIG. 3(b) is formed (FIG. 4(d)).

Figure 5:
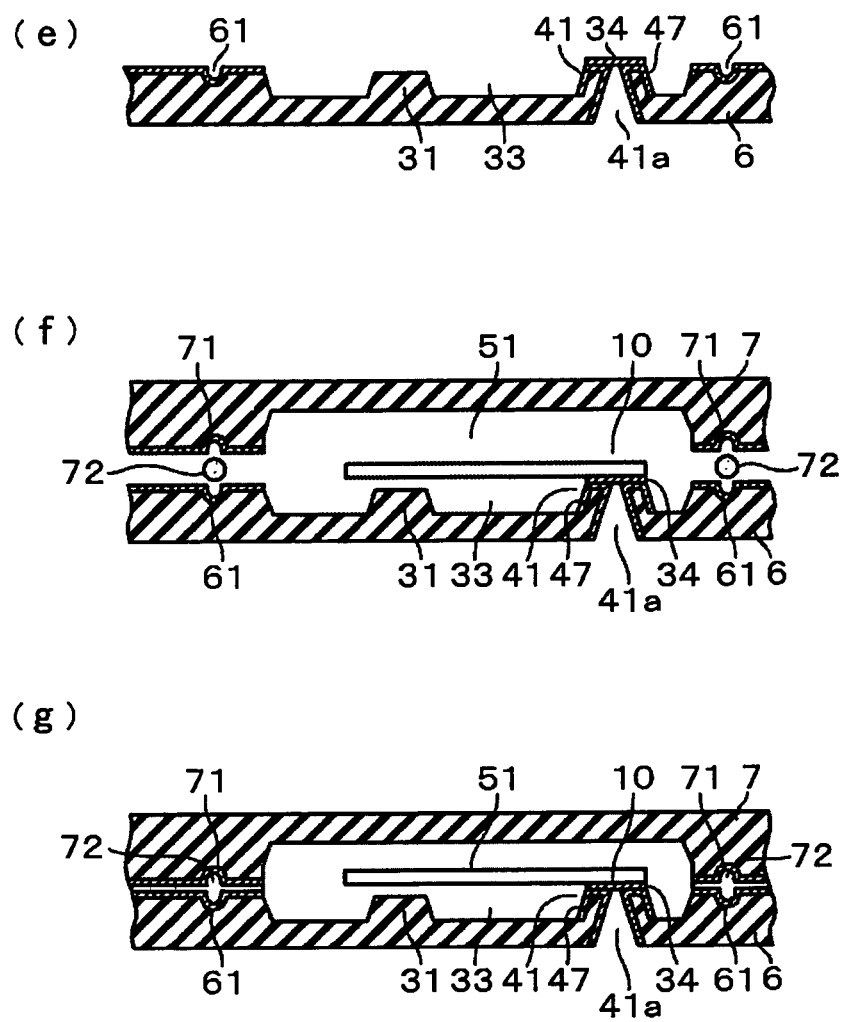
FIG. 5(e) to FIG. 5(g) are schematic cross-sectional views illustrating the method of manufacturing the crystal resonator according to the embodiment of the present invention.

Subsequently, as illustrated in FIG. 5(e) and FIG. 5(f), on the upper surfaces of the projection portions 41, 42, the conductive adhesive 34 whose product name is, for example, "XA-5463" manufactured by Fujikura kasei Co., Ltd. is coated. Then, the electrode terminals on the base portion 2 of the above-described crystal resonating piece 10 are mounted on the corresponding projection portions 41, 42 via the conductive adhesives 34 to be heated, and thereby the above-described conductive adhesives 34 are cured. A curing condition at this time is that a heating temperature is, for example, 280 degrees Celsius, and a heating time is, for example, for 90 minutes. In this manner, the electrode terminals on the crystal resonating piece 10 and the upper surfaces 43 of the projection portions 41, 42 are electrically joined via the conductive adhesives 34. By the above process, as illustrated in FIG. 7(a), the crystal resonating pieces 10 are mounted in the recessed portions 33 plurally formed in a front surface of the single glass substrate 6 respectively.

Figure 7:
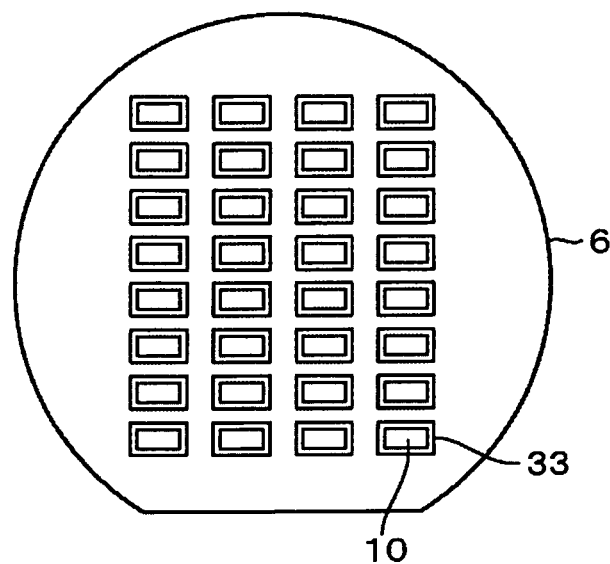
FIG. 7(a) and FIG. 7(b) are plan views illustrating a state where a plurality of crystal resonating pieces are mounted on a front surface of a crystal wafer and a state where a plurality of covers are formed on a front surface of a crystal wafer.
Figure 7:
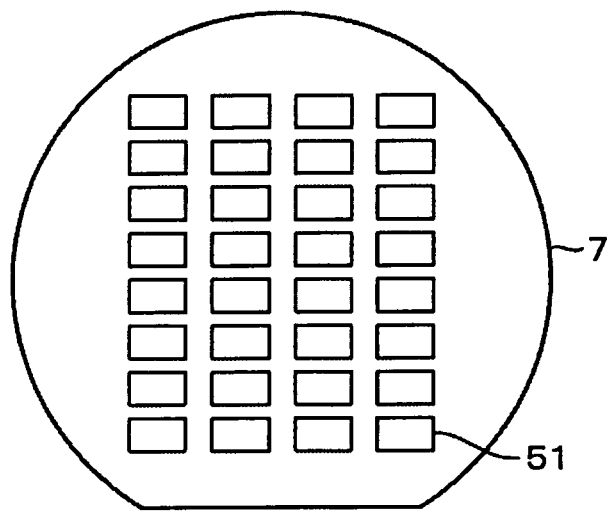

On the other hand, as for the cover 5 as well, as illustrated in FIG. 7(b), one glass substrate 7 is polished to be washed, and then is etched by a method similar to that of the base 3, and thereby the recessed portions 51 and groove portions 71 for dicing lines are formed in a front surface of the glass substrate 7, and a metal film is formed on regions corresponding to the peripheral edge portions 52 of the covers 5. The above metal film is made of a film in which, for example, Cr, NiW, and Au are stacked. Incidentally, a metal film is also formed on regions corresponding to the peripheral edge portions 30 of the bases 3 by the above-described process. The reason why the metal film is formed on the regions corresponding to the peripheral edge portions 30 of the bases 3 and the regions corresponding to the peripheral edge portions 52 of the covers 5 in this manner is to improve adhesion of later-described eutectic metal balls 72.

Then, as illustrated in FIG. 5(f), the AuSn eutectic metal ball 72 is placed in the portions of the groove portions 61 of the glass substrate 6. Thereafter, the glass substrate 7 of a caver 5 side is bonded to the front surface of the glass substrate 6 of a base 3 side in a vacuum atmosphere so that the crystal resonating pieces 10 are housed horizontally between the recessed portions 33 of the base 3 side and the recessed portions 51 of the cover 5 side respectively. Next, the portions of the eutectic metal balls 72 are heated in a vacuum to be melted, and thereby the glass substrate 7 of the cover 5 side is fixed to the front surface of the glass substrate 6 of the base 3 side (FIG. 5(g)). Incidentally, as a material of the eutectic metal ball 72, AuSi, AuGe, or the like can be used. Further, joining of the glass substrate 6 of the base 3 side and the glass substrate 7 of the cover 5 side may also be performed with low melting point glass, and in the above case, the metal films are not required to be formed on the surfaces to be joined.

Figure 6:
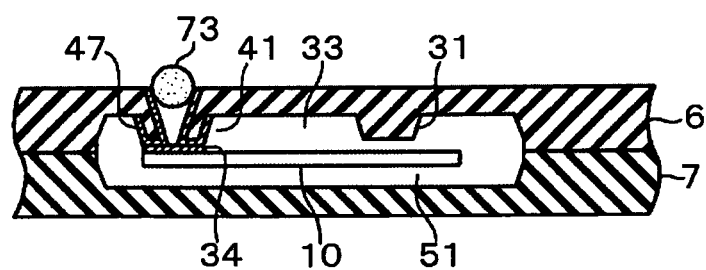
FIG. 6(h) to FIG. 6(j) are schematic cross-sectional views illustrating the method of manufacturing the crystal resonator according to the embodiment of the present invention.
Figure 6:
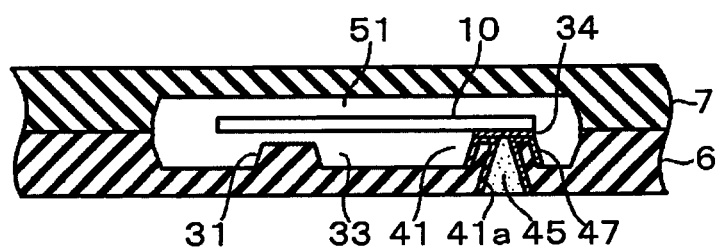
Figure 6:
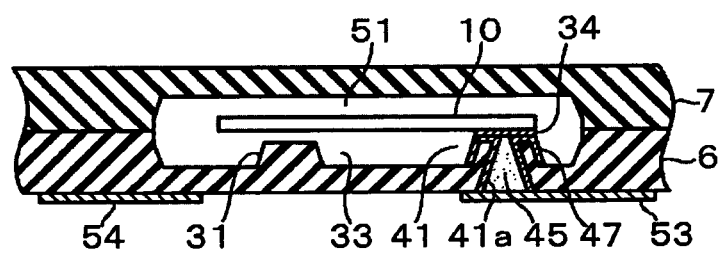

Subsequently, as illustrated in FIG. 6(h), an AuSn eutectic metal ball 73 is placed in the portions of the through holes 41a (32a), and the portions of the eutectic metal balls 73 are heated in a vacuum to be melted, and thereby the portions of the through holes 41a (32a) are filled with the eutectic metals 45, 35a and vacuum airtight sealing is performed (FIG. 6(i)). Incidentally, as a material of the eutectic metal ball 73, AuSi, AuGe, or the like can be used.

Thereafter, as illustrated in FIG. 6(j), the external terminals 53, 54 are formed by a predetermined pattern. The external terminals 53, 54 are each formed in a manner that, for example, Cr being a lower layer film, NiW being a middle layer film, and Au being an upper layer film are stacked, and, for example, a film thickness of Cr is 0.05 µm to 0.1 µm or so, a film thickness of NiW is 0.05 µm to 0.1 µm or so, and a film thickness of Au is 0.4 µm or so. Thereafter, the bonded glass substrates 6, 7 are cut along the dicing lines by using a dicing saw, and thereby the crystal resonator is cut off from the glass substrates 6, 7 one by one, and the crystal resonator illustrated in FIG. 1(a) to FIG. 1(c) is completed.

Figure 8:
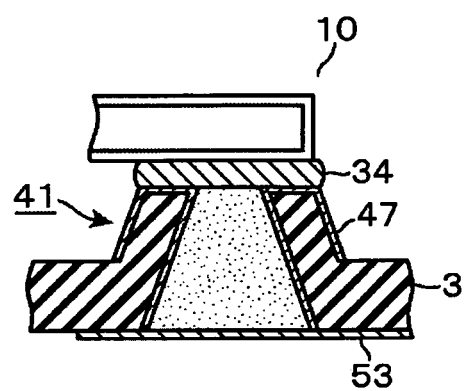
FIG. 8(a) and FIG. 8(b) are cross-sectional views illustrating a bonding portion of the crystal wafer and the crystal resonating piece.
Figure 8:
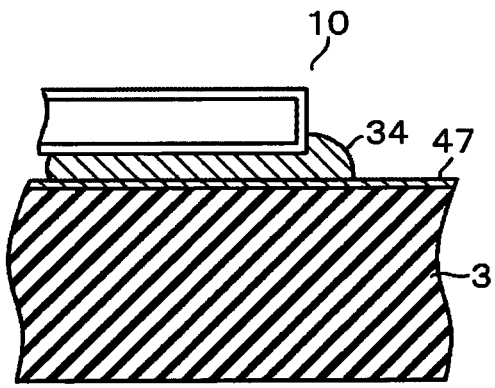

According to the above-described embodiment, at the positions, of the base 3, corresponding to the electrode terminals on the crystal resonating piece 10, the projection portions 41, 42 are provided by etching the base 3, and the metal film 47 is formed on the front surfaces of the above projection portions 41, 42, and the metal films 47 and the electrode terminals on the above-described crystal resonating piece 10 are electrically connected with the conductive adhesive 34. Thus, as illustrated in FIG. 8(a), the conductive adhesives 34 rise at slope portions on the side surfaces 46 of the projection portions 41, 42 due to surface tension and are suppressed to flow outward. As a result, it is possible to bond the electrode terminals on the crystal resonating piece 10 to the base 3 side dependently on the upper surfaces 43 of the projection portions 41, 42. Accordingly, the shapes of the upper surfaces of the projection portions 41, 42 fit to those of the electrode terminals in advance, and thereby it is suppressed that the conductive adhesives 34 spread more than necessary. In this manner, the region where the conductive adhesive 34 spreads is made uniform in each of the crystal resonators, so that occurrence of variations in terms of the device characteristic is suppressed.

On the other hand, as illustrated in FIG. 8(b), in the case when the height of the region, of the base 3, to which the electrode terminals on the crystal resonating piece 10 are connected with the conductive adhesive 34 is the same as those of other regions, the conductive adhesive 34 flows outward on the front surface of the base 3. Accordingly, on the crystal resonating piece 10, the adhesive spreads over an electrode terminal side and a conductive path 47, 48 side more than necessary, and the spread of the above conductive adhesive 34 differs in each of the crystal resonators, resulting that variations occur in terms of the device characteristic.

Further, the projection portions 41, 42 are formed by etching the glass substrate 6, and on the projection portions 41, 42, the Au film is formed, so that the film thickness of the Au film can be reduced and the crystal resonator can be manufactured at a low cost. In the above case, the glass substrate 6 is used, so that the Cr film and the Au film being the base film can be each formed to have a thin thickness by sputtering or vacuum vapor deposition and manufacturing is facilitated.

Further, a crystal wafer is wet-etched to form the projection portions 41, 42, so that by selecting etching conditions, the projection portions 41, 42 each having a shape whose cross section is enlarged downward from the upper surface 43 to the bottom portion 44 and that has slopes can be formed by using crystal plane orientations of the crystal. By the slopes on the side surfaces 46 of the above projection portions 41, 42, the outward flow of the conductive adhesives 34 is prevented as described previously, so that it is effective to etch the glass substrate 6 to then form the projection portions 41, 42. Further, only the base 3 and the cover 5 are manufactured by the glass substrates 6, 7 respectively, and an inexpensive conventional product is used as the crystal resonating piece 10, so that a more inexpensive device can be manufactured.

Figure 9:
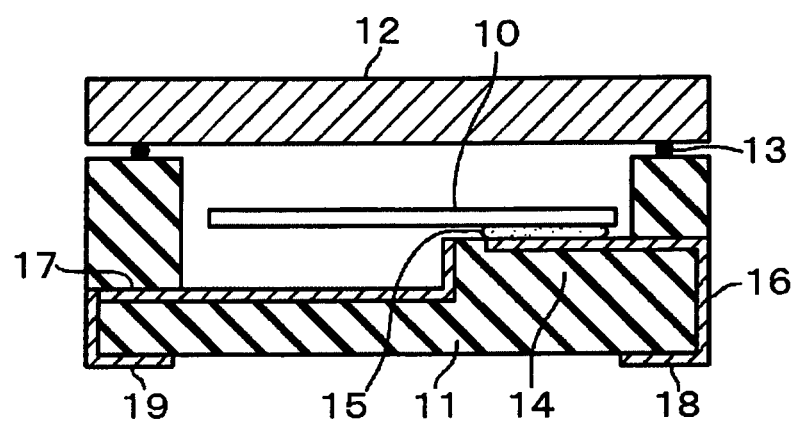
FIG. 9(a) and FIG. 9(b) are a schematic vertical cross-sectional view and a rear surface view illustrating one example of a crystal resonator.
Figure 9:
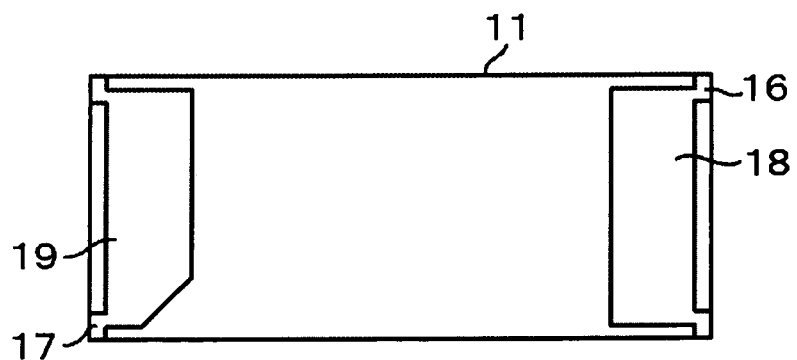

In the present invention, it is only necessary that the base 3 and the cover 5 are made of the same material, and the base 3 and the cover 5 may also be manufactured not only by the glass substrate but also by a crystal substrate. Further, in the present invention, it is only necessary that the metal film to be formed on the front surfaces of the projection portions 41, 42 is formed on at least the regions, of the projection portions 41, 42, that come into contact with the conductive adhesive 34. Further, it is possible to apply the present invention not only to the crystal resonator in a type in which power is supplied by using the through holes but also to a crystal resonator having a power supply structure as illustrated in FIG. 9(a) and FIG. 9(b).

Furthermore, it is also possible to apply the present invention to a structure in which the electrode terminal on one side on the crystal resonating piece 10 is provided on the base side of the crystal resonating piece 10 and the electrode terminal on the other side is provided on the cover side of the crystal resonating piece 10, but the structure in which both the electrode terminals on the crystal resonating piece 10 are provided on the base side of the crystal resonating piece 10 is more effective in suppressing the outward spread of the conductive adhesives and is more advantageous.

What is claimed is:

1. A piezoelectric resonator comprising:
    a base made of glass or crystal;
    a cover made of the same material as that of said base and forming an airtight space by airtightly sealing one surface side of said base;
    a piezoelectric resonating piece, in the airtight space, placed on said base and having excitation electrodes formed on a front surface thereof and having first and second electrode terminals that are electrically connected to the excitation electrodes, the first and second electrode terminals being provided on a surface of the piezoelectric resonating piece faced to the base;
    first and second projection portions formed at positions corresponding to the first and second electrode terminals on said piezoelectric resonating piece respectively by etching said base and whose upper surfaces are flat;
    a metal film formed on front surfaces of said projection portions and electrically connected to external terminals; and
    a conductive adhesive coated on an entire upper surface of each of the first and second projection portions for electrically connecting said metal films and the electrode terminals on said piezoelectric resonating piece respectively; and
    wherein the first and second projection portions are provided independently of each other and have shapes that continuously spread out downward from the upper surfaces, around an entire perimeter of the first and second projection portions.

2. The piezoelectric resonator according to claim 1, wherein a distance between the upper surface and a bottom portion of each of said projection portions is not less than 10 μm nor more than 50 μm.

3. The piezoelectric resonator according to claim 1, wherein a thickness of said metal film is not less than 0.2 μm nor more than 0.5 μm.

4. A method of manufacturing a piezoelectric resonator being a method of manufacturing the piezoelectric resonator according to claim 1, the method comprising:
    forming a base provided with a recessed portion in which a piezoelectric resonating piece is housed and with first and second projection portions by etching a front surface of a glass substrate or a crystal substrate with a mask;
    forming a metal film on a front surface of the above base;
    forming a metal film on a front surface of each of the first and second projection portions by etching the metal film;
    coating conductive adhesive on an upper surface of each of the first and second projection portions; and
    providing a piezoelectric resonating piece on the conductive adhesive on the upper surface of each of the first and second projection portions, the piezoelectric resonating piece having excitation electrodes and having first and second electrode terminals that are electrically connected to the excitation electrodes, the first and second electrode terminals being positioned on the metal film on the front surface of the first and second projection portions, respectively.

* * * * *